United States Patent
Masuoka et al.

(10) Patent No.: US 8,754,487 B2
(45) Date of Patent: Jun. 17, 2014

(54) SEMICONDUCTOR DEVICE WITH METAL GATE

(71) Applicant: Taiwan Semiconductor Manufacturing Company, LTD, Hsin-Chu (TW)

(72) Inventors: Yuri Masuoka, Jhubei (TW); Huan-Tsung Huang, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/715,170

(22) Filed: Dec. 14, 2012

(65) Prior Publication Data

US 2013/0119485 A1    May 16, 2013

Related U.S. Application Data

(62) Division of application No. 13/217,442, filed on Aug. 25, 2011, now Pat. No. 8,357,581, which is a division of application No. 12/437,696, filed on May 8, 2009, now Pat. No. 8,012,817.

(60) Provisional application No. 61/100,592, filed on Sep. 26, 2008.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC ............. 257/412; 257/E21.438; 438/303

(58) Field of Classification Search
USPC ............. 257/412, E21.438; 438/303
See application file for complete search history.

(56) References Cited

U.S. PATENT DOCUMENTS

| | | | |
|---|---|---|---|
| 7,396,767 B2 * | 7/2008 | Wu et al. | 438/682 |
| 2008/0206988 A1 * | 8/2008 | Kohli et al. | 438/664 |
| 2008/0211000 A1 * | 9/2008 | Matsuki | 257/296 |
| 2009/0159976 A1 * | 6/2009 | Goldbach et al. | 257/368 |

* cited by examiner

*Primary Examiner* — Phuc Dang
(74) *Attorney, Agent, or Firm* — Haynes and Boone, LLP

(57) ABSTRACT

The present disclosure provides a method for making a semiconductor device having metal gate stacks. The method includes forming a high k dielectric material layer on a semiconductor substrate; forming a first metal layer on the high k dielectric material layer; forming a silicon layer on the first metal layer; patterning the silicon layer, the first metal layer and the high k dielectric material layer to form a gate stack; and performing a silicidation process to fully change the silicon layer into a silicide electrode.

12 Claims, 6 Drawing Sheets

SEMICONDUCTOR DEVICE WITH METAL GATE

CROSS-REFERENCE

The present application is a divisional application of U.S. patent application Ser. No. 13/217,442, filed Aug. 25, 2011, now U.S. Pat. No. 8,357,581 issued Jan. 22, 2013, entitled "TRANSISTOR PERFORMANCE IMPROVING METHOD WITH METAL GATE," which is a divisional of U.S. Pat. No. 8,012,817 issued Sep. 6, 2011, which claims priority to Provisional Application Ser. No. 61/100,592 filed on Sep. 26, 2008, the entire disclosure of which is incorporated herein by reference.

BACKGROUND

When a semiconductor device such as a metal-oxide-semiconductor field-effect transistors (MOSFETs) is scaled down through various technology nodes, high k dielectric materials and metals are adopted to form a gate stack. Additionally, a strained silicon is used to enhance the mobility of the transistor channel. In a conventional method, a silicon nitride layer, ion implantation and annealing procedure is implemented to form the strained substrate. On other side, the work function is tuned to improve the device performance. The current approach can damage the high k dielectric material layer and the substrate, considering that the high k dielectric material layer is very thin. Furthermore, the above method to form the strained substrate is difficult to achieve a large stress.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
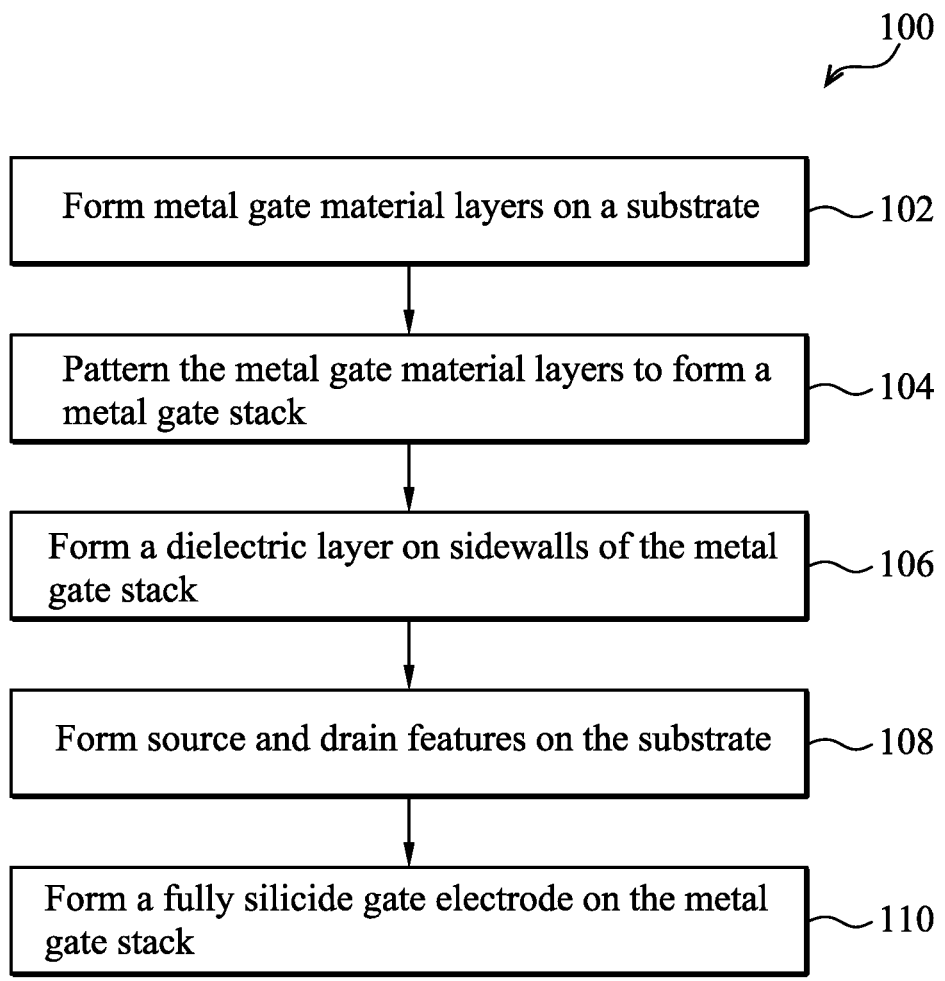
FIG. 1 is a flowchart of a method for making a semiconductor device having a metal gate structure constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device having a metal gate structure constructed according to aspects of the present disclosure. FIGS. 2 through 5 are sectional views of a semiconductor device 200 having a metal gate structure constructed according to aspects of the present disclosure in various embodiments. The semiconductor device 200 and the method 100 of making the same are collectively described below.

Figure 2:
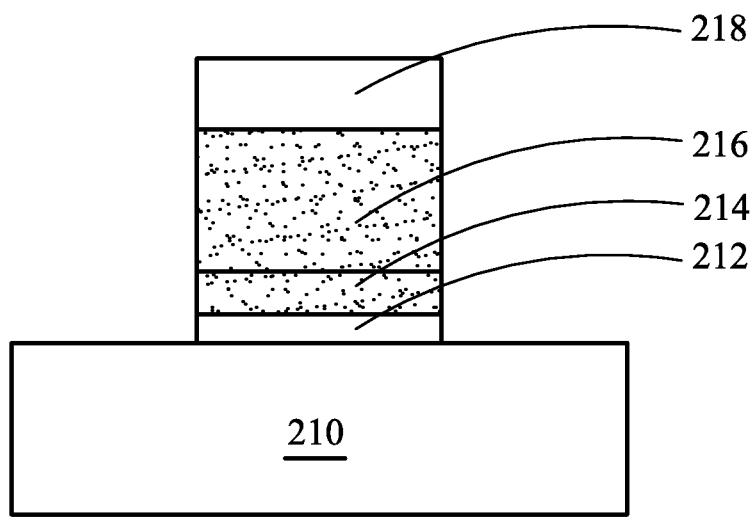
FIGS. 2 through 5 are sectional views of a semiconductor device having a metal gate structure constructed according to aspects of the present disclosure in one or more embodiments.

Referring to FIGS. 1 and 2, the method 100 begins at step 102 by forming various gate material layers on a semiconductor substrate 210. The semiconductor substrate 210 includes silicon. The substrate further includes various isolation features, such as shallow trench isolation (STI), and various doped features, such as n type wells and p type wells formed by various ion implantation or diffusion techniques known in the art. The substrate 210 may additionally include germanium, silicon germanium or other suitable semiconductor material. In other embodiments, the substrate 210 may additionally include another semiconductor material such as diamond, silicon carbide, gallium arsenic, GaAsP, AlInAs, AlGaAs, GaInP, or other proper combination thereof.

At this step, a high k dielectric material layer 212 is formed on the substrate. The high k dielectric material layer 212 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes $HfO_2$. Alternatively, the high k dielectric material layer includes metal nitrides, metal silicates or other metal oxides.

An interfacial layer (IL) (not shown) may be additionally formed on the substrate and is interposed between the semiconductor substrate 210 and the high k dielectric material layer 212. The interfacial layer includes a thin silicon oxide layer in one example. The thin silicon oxide is formed on the substrate 210 before forming the high k dielectric material layer. The thin silicon oxide layer may be formed by atomic layer deposition (ALD) or thermal oxidation.

A metal layer 214 is formed on the high k dielectric material layer. The metal layer 214 is formed by PVD or other suitable process. In one embodiment, the metal layer includes titanium nitride. In another embodiment, the metal gate layer may include tantalum nitride, molybdenum nitride, tungsten nitride, tungsten, tantalum carbide, tantalum carbide nitride, titanium aluminum nitride or a combination thereof. The metal layer is chosen to have a proper work function. In one embodiment, the metal layer 214 has a thickness less than about 50 angstrom. In another embodiment, the metal layer may have a multi-film structure designed to have a proper work function.

A capping layer (not shown) may be disposed on the high k dielectric material layer. The capping layer is interposed between the high k dielectric material layer and the metal layer. In one embodiment, the capping layer includes lanthanum oxide (LaO). The capping layer may alternatively includes other suitable material, such as aluminum oxide (Al2O3). The capping layer can be formed by a suitable process, such as PVD or ALD.

A silicon layer 216 is further formed on the metal layer 214. In one embodiment, the silicon layer includes polysilicon. In another embodiment, the silicon layer include amorphous silicon. The silicon layer may be formed by a chemical vapor deposition (CVD) process. Silane (SiH4) can be employed a chemical gas in the CVD process to form the silicon layer. In one embodiment, the silicon layer has a thickness less than about 700 angstrom. For one example, the silicon layer has a thickness of about 600 angstrom.

A hard mask layer 218 may be further formed on the silicon layer 216 for gate patterning. The hard mask layer 218 include one or more dielectric materials and is formed by a suitable process, such as CVD. In various embodiments, the hard mask layer includes silicon oxide, silicon nitride, silicon oxynitride or a combination thereof in a multi-film structure.

Still referring to FIGS. 1 and 2, the method 100 proceeds to step 104 by patterning the various gate material layers to form a gate stack. A patterned photresist layer is formed on the hard mask layer, defining one or more openings of the photoresist layer. Then the hard mask layer is etched away within the openings of the patterned photoresist layer, resulting in a patterned hard mask layer. The etching process applied to the hard mask layer can be a wet etching process or a dry etching process. For example, a hydrofluoric (HF) solution may be used to etch a silicon oxide hard mask layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. Alternatively, the hard mask layer may be avoid. In this case, the gate layers are patterned by directly forming a patterned photoresist layer on the silicon layer and then etching the gate layers using the patterned photoresist layer as an etching mask.

Then the various gate material layers are etched away within the openings of the patterned hard mask layer by an etching process. In one embodiment, the etching process utilizes a dry etching process. In one example, the dry etching process implements a fluorine-containing plasma to remove the silicon layer. In another example, the dry etching process with the fluorine-containing plasma is implemented to remove the silicon layer, the metal layer and the high k dielectric material layer. In furtherance of the example, the etch gas includes CF4. Alternatively, the etching process may include multiple etching steps to etch the various gate material layers. In an embodiment, the gate stack has a gate length less than 50 nm.

Figure 3:
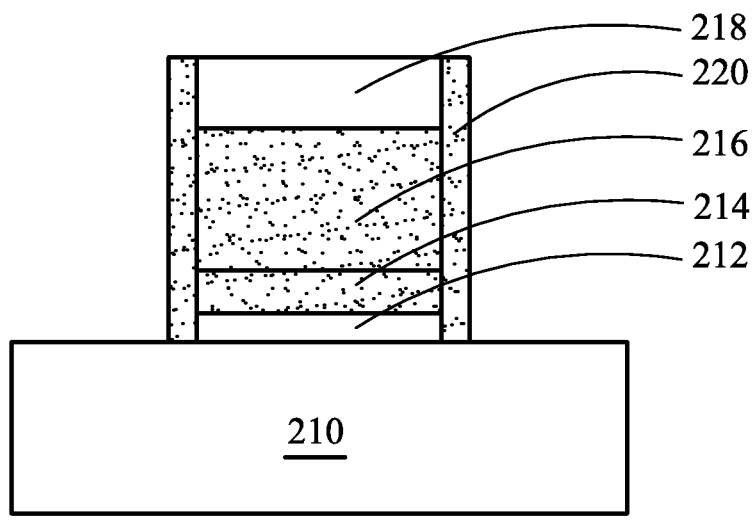

Referring to FIGS. 1 and 3, the method 100 may proceed to step 106 by forming a dielectric layer 220 on the sidewalls of the gate stack. The dielectric layer 220 is disposed on the sidewalls of the gate stack such that the subsequent formation of source/drain features are offset from the gate stack for better device performance. Additionally or alternatively, the dielectric layer is used to seal the high k dielectric material layer and the metal, therefore protecting these gate materials. The dielectric layer 220 includes silicon oxide, silicon nitride or other suitable dielectric material. The dielectric layer 220 can be formed by CVD, PVD or other suitable process.

Figure 4:
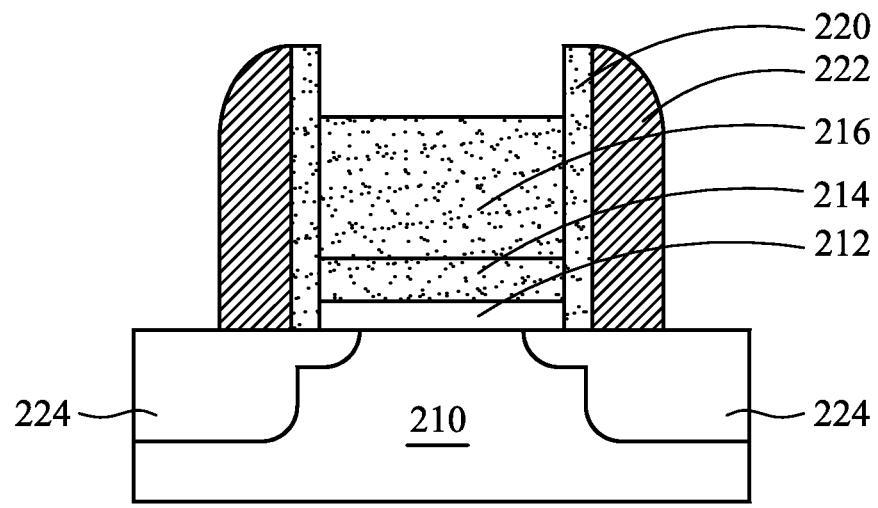

Referring to FIGS. 1 and 4, the method 100 proceeds to step 108 by forming various source and drain features on the substrate 210. In one embodiment, a light doped drain (LDD) regions are formed by an ion implantation process using the gate stack as an implanting mask. The LDD regions are substantially aligned with the edges of the gate stack. If the dielectric layer is present, the LDD regions are offset from the edge of the gate stack by the dielectric layer. Additionally, a halo implantation process may be implemented to eliminate the short channel effect.

Then a spacer 222 is formed on the sidewalls of the gate stack (or the sidewalls of the dielectric layer if present) by a technique known in the art. For example, the spacer includes silicon nitride and is formed by a chemical vapor deposition (CVD) and then a dry etching process. The spacer 222 may have a multiple-layer structure.

Then a source and a drain are formed in the substrate by another ion implantation process. Thus formed source and drain are further offset from the gate stack by the spacer 222. The LDD regions and the source/drains are collectively labeled as 224 in FIG. 4. An annealing process is applied thereafter to the substrate to activate the source/drain features 224. The annealing process can be implemented by a suitable method, such as rapid thermal annealing or laser annealing.

The hard mask 218 is removed from the gate stack by an etching process. For example, if the hard mask is made of silicon nitride, a hot phosphoric acid (H3PO4) solution is used as an ethcant to selectively remove the hard mask layer. The removal of the hard mask can be implemented after the ion implantation to form the source and drain in one embodiment. In another embodiment, the hard mask layer is removed after the formation of the spacer 222 and before the second ion implantation used to form the source and drain.

Figure 5:
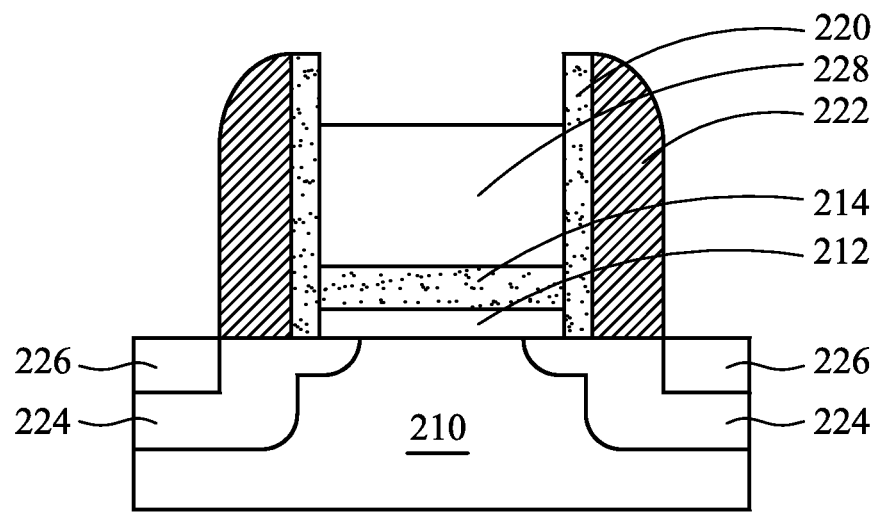

Referring to FIGS. 1 and 5, the method 100 proceeds to step 110 by forming a fully silicide layer 228 on the gate stack. A self-aligned silicide technique is used to fully change the silicon layer 216 into the silicide layer 228. As an embodiment of a procedure to form the fully silicide layer, a second metal layer is first deposited on the substrate. The second metal layer directly contacts the silicon layer within the gate region. Then an annealing process with a proper temperature is applied to the semiconductor device 200 such that the second metal layer and the silicon layer react to form silicide. The annealing process is performed until the silicon layer is fully changed into the silicide layer. The unreacted metal after the annealing can be removed from the substrate.

The metal material for silicide includes titanium, nickel, cobalt, platinum, palladium tungsten, tantalum or erbium in various embodiment. The formed silicide may can be in any proper composition and phase, determined by various parameters including the annealing temperature and the thickness of the second metal layer. In one embodiment, the silicide layer 228 has a graded structure such that the silicide composition/phase may change vertically. In another embodiment, the silicide layer 228 has a phase/composition, such as MSi, MSi2, M2Si, M2Si3, M3Si2, or M3Si, in which the "M" represent the second metal.

The annealing temperature for the reaction between the second metal layer and the silicon layer ranges between about 200 C and 500 C. After the formation of the silicide during the first annealing process, a second annealing at a higher temperature may be applied to the semiconductor device for transferring the silicide to a certain phase state to reduce the resistance and/or to tune the work function.

When the silicon layer is changed to the silicide layer, the metal layer is incorporated the silicon layer, and a stress is built in the gate stack. The stress is further pass to the substrate underlying the gate stack to form the strained channel region. The silicide volume expansion effect is employed to generate and tune the channel stress for device performance. Furthermore, the work function is independently determined by the metal layer 214. Thus the stress and the work function can be separately designed and tuned properly. The stress induced damage to the high k dielectric material and the substrate associated with the conventional method is also eliminated.

When the silicide is formed on the gate stack, the top portion of the source and drain are silicided as well, resulting in the source/drain silicide 226. However, the spacer and the isolation features are not silicided because of their dielectric characteristics. The silicide is only formed on the gate stack and the source and drain, and self aligned with those features. Therefore, the process is referred to as the self-aligned silicide (salicide) technique. Since the silicon substrate is in crystalline state and the silicon layer is in polycrystalline state or amorphous state, the silicidation rate to the source/drain is different than that to the silicon layer. The silicidation rate to the silicon layer can be substantially higher than the silicidation rate to the source/drain. The ratio of the silicidation rates can be determined and tuned by the first annealing temperature associated with the silicide formation. Thus, the annealing temperature can be chosen such that the silicon layer is fully silicided to the silicide electrode 228 and the source/drain silicide 226 has a proper thickness.

The above method is referred to as a gate-first method since thus formed gate will remain in the final device. Then the conventional process flow may follow to other features of the semiconductor device 200. For example, an interconnection structure is formed to properly connect various features of the semiconductor device 200. In another example, an inter-level dielectric (ILD) layer is formed on the substrate, then a chemical mechanical polishing (CMP) process is applied to the substrate, and then the contacts to the source/drain and the gate are formed in the ILD.

Figure 6:
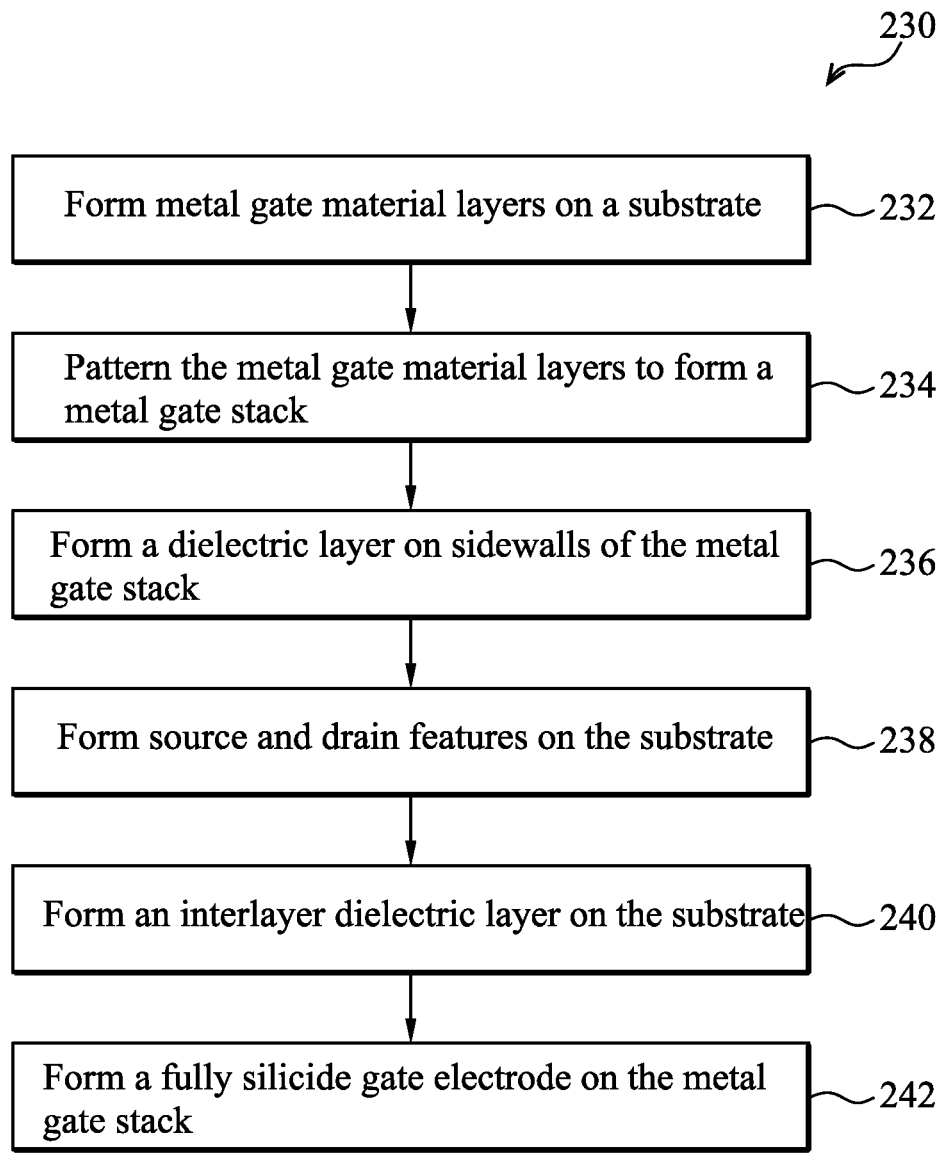
FIG. 6 is a flowchart of a method for making a semiconductor device having a metal gate structure constructed according to aspects of the present disclosure in another embodiment.

FIG. 6 is a flowchart of a method 230 for making a semiconductor device having a metal gate structure constructed according to aspects of the present disclosure in another embodiment. The method 230 is applicable to a gate-last process, in which a portion of the gate stack is removed thereafter and rebuilt for proper work function tuned to a nMOS transistor or a pMos transistor. FIGS. 7 through 10 are sectional views of a semiconductor device 250 having a metal gate structure constructed according to aspects of the present disclosure in various embodiments. The semiconductor device 250 and the method 230 of making the same are collectively described below. The semiconductor device 250 is similar to the semiconductor device 200 of FIGS. 2-5. Accordingly, similar features are numbered the same for the sake of simplicity and clarity.

Figure 7:
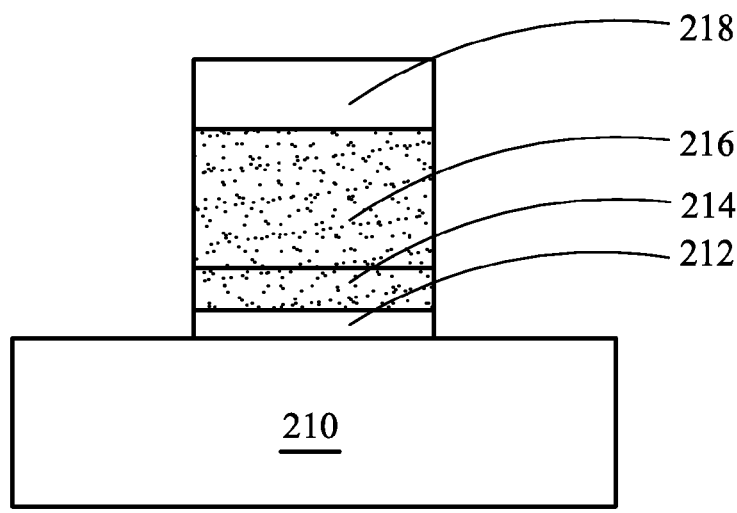
FIGS. 7 through 10 are sectional views of a semiconductor structure having a metal gate structure at various fabrication stages constructed according to various aspects of the present disclosure in other embodiments.

Referring to FIGS. 6 and 7, the method 230 begins at step 232 by forming various gate material layers on a semiconductor substrate 210, similar to the step 102 of the method 100. The semiconductor substrate 210 includes silicon. The substrate further includes various isolation features, such as shallow trench isolation (STI), and various doped features, such as n type wells and p type wells formed by various ion implantation or diffusion techniques known in the art. The substrate 210 may additionally include germanium, silicon germanium or other suitable semiconductor material.

At this step, a high k dielectric material layer 212 is formed on the substrate. The high k dielectric material layer 212 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material includes metal nitrides, metal silicates or other metal oxides.

An interfacial layer (IL) (not shown) may be additionally formed on the substrate and is interposed between the semiconductor substrate 210 and the high k dielectric material layer 212. The interfacial layer includes a thin silicon oxide layer in one example. The thin silicon oxide is formed on the substrate 210 before forming the high k dielectric material layer. The thin silicon oxide layer may be formed by atomic layer deposition (ALD) or thermal oxidation.

A metal layer 214 is formed on the high k dielectric material layer. The metal layer 214 is formed by PVD or other suitable process. In one embodiment, the metal layer includes titanium nitride. In another embodiment, the metal gate layer may include tantalum nitride, molybdenum nitride, tungsten nitride, tungsten, tantalum carbide, tantalum carbide nitride, titanium aluminum nitride or a combination thereof. The metal layer is chosen to have a proper work function. In one embodiment, the metal layer 214 has a thickness less than about 50 angstrom. In another embodiment, the metal layer may have a multi-film structure designed to have a proper work function.

A capping layer (not shown) may be disposed on the high k dielectric material layer. The capping layer is interposed between the high k dielectric material layer and the metal layer. In one embodiment, the capping layer includes lanthanum oxide (LaO). The capping layer may alternatively includes other suitable material, such as aluminum oxide (Al2O3). The capping layer can be formed by a suitable process, such as PVD or ALD.

A silicon layer 216 is further formed on the metal layer 214. In one embodiment, the silicon layer includes polysilicon. In another embodiment, the silicon layer include amorphous silicon. The silicon layer may be formed by a CVD process. Silane (SiH4) can be employed a chemical gas in the CVD process to form the silicon layer. In one embodiment, the silicon layer has a thickness less than about 700 angstrom. For one example, the silicon layer has a thickness of about 600 angstrom.

A hard mask layer 218 may be further formed on the silicon layer 216 for gate patterning. The hard mask layer 218 include one or more dielectric materials and is formed by a suitable process, such as CVD. In various embodiments, the hard mask layer includes silicon oxide, silicon nitride, silicon oxynitride or a combination thereof in a multi-film structure.

Still referring to FIGS. 6 and 7, the method 230 proceeds to step 234 by patterning the various gate material layers to form a gate stack. A patterned photoresist layer is formed on the hard mask layer, defining one or more openings of the photoresist layer. Then the hard mask layer is etched away within the openings of the patterned photoresist layer, resulting in a patterned hard mask layer. The etching process applied to the hard mask layer can be a wet etching process or a dry etching process. For example, a hydrofluoric solution may be used to etch a silicon oxide hard mask layer. The patterned photoresist layer is formed by a photolithography process. Alternatively, the hard mask layer may be avoid. In this case, the gate layers are patterned by directly forming a patterned photoresist layer on the silicon layer and then etching the gate layers using the patterned photoresist layer as an etching mask.

Then the various gate material layers are etched away within the openings of the patterned hard mask layer by an etching process. In one embodiment, the etching process utilizes a dry etching process. In one example, the dry etching process implements a fluorine-containing plasma to remove the silicon layer. In another example, the dry etching process with the fluorine-containing plasma is implemented to remove the silicon layer, the metal layer and the high k dielectric material layer. In furtherance of the example, the etch gas includes CF4. Alternatively, the etching process may include multiple etching steps to etch the various gate material layers. In one embodiment, the gate stack has a gate length less than 50 nm.

Figure 8:
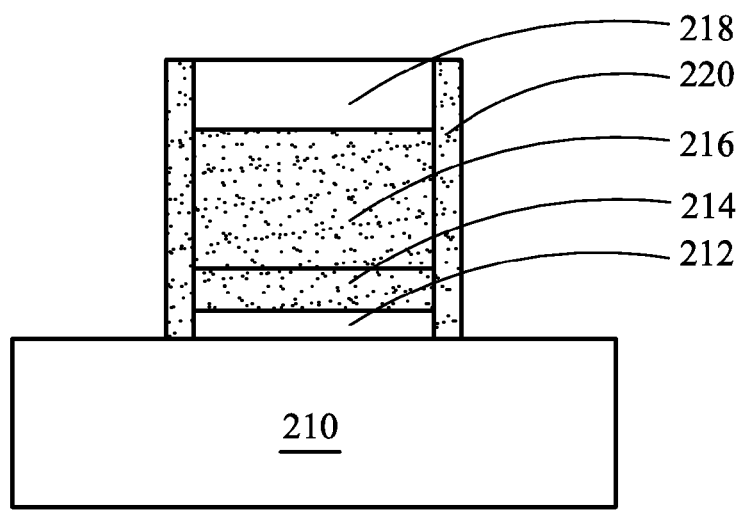

Referring to FIGS. 6 and 8, the method 230 may proceed to step 236 by forming a dielectric layer 220 on the sidewalls of the gate stack. The dielectric layer 220 is disposed on the sidewalls of the gate stack such that the subsequent formation of source/drain features are offset from the gate stack for better device performance. Additionally or alternatively, the dielectric layer is used to seal the high k dielectric material layer and the metal, therefore protecting these gate materials. The dielectric layer 220 includes silicon oxide, silicon nitride or other suitable dielectric material. The dielectric layer 220 can be formed by CVD, PVD or other suitable process.

Figure 9:
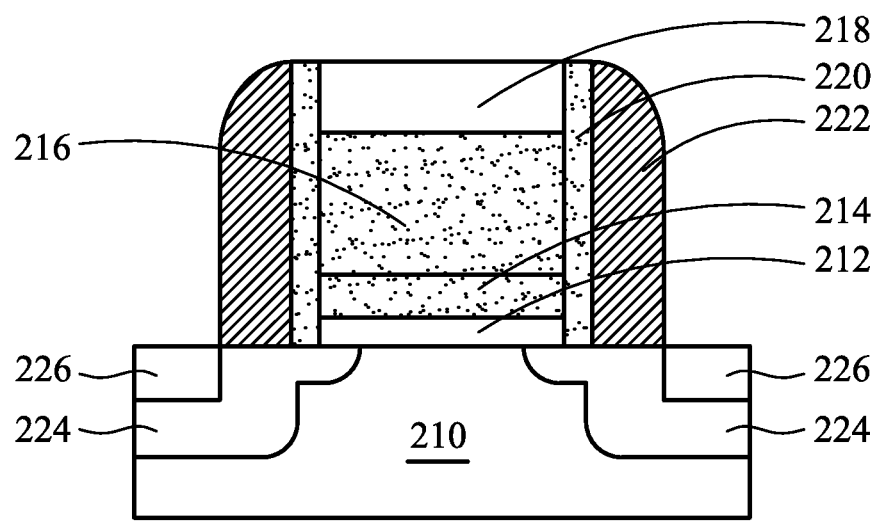

Referring to FIGS. 6 and 9, the method 230 proceeds to step 238 by forming various source and drain features on the substrate 210. In one embodiment, a LDD regions are formed by an ion implantation process using the gate stack as an implanting mask. LDD regions are substantially aligned with the edges of the gate stack. If the dielectric layer is present, the LDD regions are offset from the edge of the gate stack by the dielectric layer. Additionally, a halo implantation process may be implemented to eliminate the short channel effect.

Then a spacer 222 is formed on the sidewalls of the gate stack (or the sidewalls of the dielectric layer if present) by a technique known in the art. For example, the spacer includes silicon nitride and is formed by a CVD and then a dry etching process. The spacer may have a multiple-layer structure.

Then a source and a drain are formed in the substrate by another ion implantation process. Thus formed source and drain are further offset from the gate stack by the spacer 222. The LDD regions and the source/drains are collectively labeled as 224 in FIG. 4. An annealing process is applied thereafter to the substrate to activate the source/drain features 224. The annealing process can be implemented by a suitable method, such as rapid thermal annealing or laser annealing.

Silicide features may be formed on the source and drain at this step by a salicide technique, including metal deposition, annealing and etching to remove the excessive metal unreacted with the silicon substrate. Since the hard mask is on the top of the gate stack, therefore, the silicide will not formed on the gate stack at this time.

Figure 10:
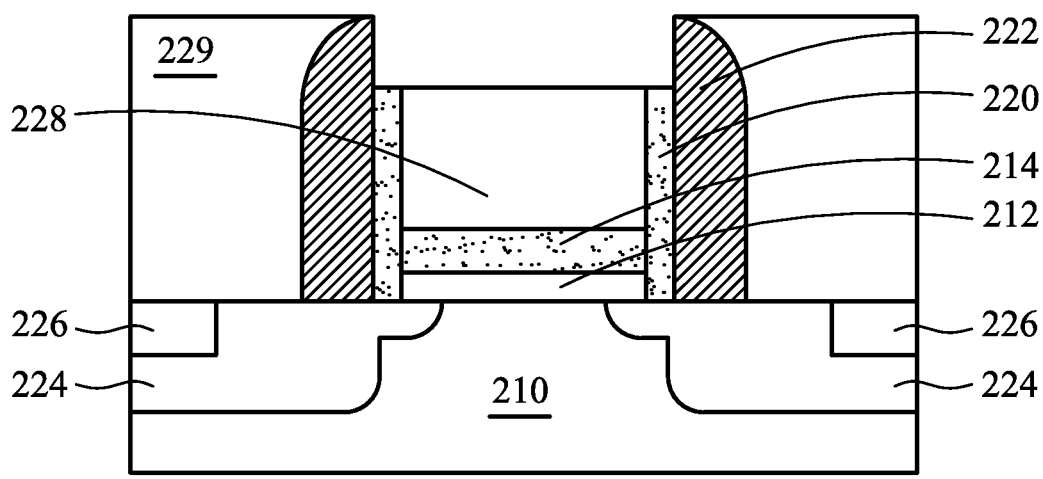

Referring to FIGS. 6 and 10, the method 230 may proceed to step 240 by forming an inter-level dielectric (ILD) layer 229 on the substrate using a suitable process, such as CVD or spin-on glass (SOG). The ILD includes a dielectric material, such as silicon oxide, low k dielectric material or other suitable dielectric material. For example, the ILD layer is formed by a high density plasma CVD. The ILD layer is disposed on the substrate between the multiples gate stacks and on the gate stacks.

Then a chemical mechanical polishing (CMP) process is applied to the substrate to polish until the gate stack is exposed or the hard mask layer is exposed if the hard mask layer is present. In this case, the hard mask layer also function as an etch stop layer. An additional wet etching process is applied to selectively remove the hard mask. For example, if the hard mask is made of silicon nitride, a hot phosphoric acid (H3PO4) solution is used as an etchant to selectively remove the hard mask layer. The removal of the hard mask can be implemented after the ion implantation to form the source and drain in one embodiment. In another embodiment, the hard mask layer is removed after the formation of the spacer 222 and before the second ion implantation used to form the source and drain. Alternatively, the CMP process may resume to remove the hard mask layer as well. In yet another embodiment, the silicon layer 216 and metal layer 214 may be removed so that another metal layer and silicon layer may be deposited for the metal gate electrode. The excess silicon layer may be removed by a CMP process until the ILD layer is exposed.

Still referring to FIGS. 6 and 10, the method 230 proceeds to step 242 by forming a fully silicide layer 228 on the gate stack. Similarly, the self-aligned silicide technique is used to fully change the silicon layer 216 into the silicide layer 228. As an embodiment of a procedure to form the fully silicide layer, a second metal layer is first deposited on the substrate. The second metal layer directly contacts the silicon layer within the gate trench. Then an annealing process with a proper temperature is applied to the semiconductor device 250 such that the second metal layer and the silicon layer react to form silicide. The annealing process is performed until the silicon layer is fully changed into the silicide layer. The unreacted metal after the annealing can be removed from the substrate.

The metal material for silicide includes titanium, nickel, cobalt, platinum, palladium tungsten, tantalum or erbium in various embodiment. The formed silicide may can be in any proper composition and phase, determined by various parameters including the annealing temperature and the thickness of the second metal layer. In one embodiment, the silicide layer 228 has a phase/composition, such as MSi, MSi2, M2Si, M2Si3, M3Si2, or M3Si, in which the "M" represent the second metal.

The annealing temperature for the reaction between the second metal layer and the silicon layer ranges between about 200 C and 500 C. After the formation of the silicide during the first annealing process, a second annealing at a higher temperature may be applied to the semiconductor device for transferring the silicide to a certain phase state to reduce the resistance and/or to tune the work function.

In this case, the fully silicide gate electrode and the source/drain silicide are formed separately. Therefore, the source/drain silicide thickness can be independently controlled. When the silicon layer is changed to the silicide layer, the metal layer is incorporated the silicon layer, a stress is built in the gate stack. The stress is further pass to the substrate underlying the gate stack to form the strained channel region. The silicide volume expansion effect is employed to generate and tune the channel stress for device performance. Furthermore, the work function is independently determined by the metal layer 214. Thus the stress and the work function can be separately designed and tuned properly. The stress induced damage to the high k dielectric material and the substrate associated with the conventional method is also eliminated.

As one example, the fully silicide gate electrode is formed for one type of MOS gate, such as an n MOS gate while another type of MOS gate, such as a p MOS gate, is covered by a patterned photoresist layer or a patterned hard mask. Then, the silicon layer 216 and the metal layer 214 within the p MOS region is removed from the gate stack, resulting in a gate trench, by one or more etching steps. The dielectric layer 220 may be partially or completely removed as well simultaneously from the gate trench during the various etching steps implemented to remove the hard mask layer, the silicon layer and the metal layer.

Then a p metal layer is deposited in the p gate trench for the proper work function. An additional conductive material, such as aluminum or tungsten, is formed on the metal layer. A CMP process is then applied to remove the excessive conductive material and planarize the substrate surface for subsequent processing steps.

Although not shown, other processing step may present to form various doped regions such as n-wells and p-wells, devices features such as multilayer interconnection (MLI). In one embodiment, the multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In another embodiment, the isolation features in the substrate may include shallow trench isolation (STI). The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

In another embodiment, the metal layer for an n-type MOS transistor is different from the metal layers of the p-type MOS with individual tuned work functions. In another example, the gate spacers may have a multilayer structure and may include silicon oxide, silicon nitride, silicon oxynitride, or other dielectric material. N-type dopant impurities employed to form the associated doped regions may include phosphorus, arsenic, and/or other materials. P-type dopant impurities may include boron, indium, and/or other materials.

The present disclosure is not limited to applications in which the semiconductor structure includes a MOS transistor, and may be extended to other integrated circuit having a metal gate stack. For example, the semiconductor device may include a dynamic random access memory (DRAM) cell, a single electron transistor (SET), and/or other microelectronic devices (collectively referred to herein as microelectronic devices). In another embodiment, the semiconductor device 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the semiconductor substrate may include an epitaxial layer. For example, the substrate may have an epitaxial layer overlying a bulk semiconductor. In another embodiment, the substrate includes silicon germanium in the source and drain formed by a selective epitaxial growth (SEG) process for the strain effect. The stress is built in the channel region by utilizing the disclosed fully silicide gate approach. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, SEG, or other proper method.

Furthermore, the various gate stacks can be formed by a hybrid approach wherein one type of stacks are formed by a gate-first approach and the another type gate stacks are formed by a gate-last approach. In this case, at least one of the gate-first or gate-last approaches adopts the disclosed method utilizing the fully silicide gate electrode for the stress enhancement. In one example, an n metal is deposited on both a p transistor region and an n transistor region, then the metal gate stack to the n transistor is formed by a gate-first approach. Then the gate stack to the p transistor is formed by a gate-last process wherein the fully silicide gate is formed by method 230. Additionally, the source and drain of the p transistor may also include silicon germanium source/drain features formed by a SEG process. Such an integrated process can enhance the strained channel of the p transistor for better device performance.

In another embodiment, a p MOS transistor is formed by a gate-last process utilizing the fully silicide gate electrode process for stress enhancement, similar to the method 230. When the fully gate silicidation process is implemented to the p MOS transistor, the n MOS transistor is covered by a patterned photoresist layer. Alternatively, the hard mask layer in the p MOS region is removed and the hard mask in the p MOS region remains by a lithography process before applying the fully silicidation process to the p MOS transistor. Thereafter, the gate stack of the n MOS transistor is replaced by a gate-last process, including removing at least a portion of the n MOS gate stack, then refilling a n metal layer to form the n MOS gate stack with work function tuned properly by the n metal layer. Other combinations of the method 100 and the method 230 may be implemented to form an n MOS transistor and a p MOS transistor with tuned work functions.

Thus, the present disclosure provides a method for making an integrated circuit having metal gate stacks. The method includes forming a high k dielectric material layer on a semiconductor substrate; forming a first metal layer on the high k dielectric material layer; forming a silicon layer on the first metal layer; patterning the silicon layer, the first metal layer and the high k dielectric material layer to form a gate stack; and performing a silicidation process to fully change the silicon layer into a silicide electrode.

In this method, the performing the silicidation process may include forming a second metal layer on the silicon layer; reacting the silicon layer and the second metal layer to form a silicide layer, by an annealing process to react; and removing unreacted second metal layer. The forming the first metal layer may include forming a titanium nitride (TiN) layer. The forming the first metal layer may include forming a multiple-film structure. The forming the first metal layer may include forming a capping film on the high k dielectric material layer; and forming a metal film on the capping film. The forming the silicon layer may include forming the silicon layer having a thickness of less than about 700 angstrom. The method may further include forming a dielectric layer on sidewalls of the gate stack after the patterning the silicon layer, the first metal layer and the high k dielectric material layer; thereafter forming a light doped drain (LDD) features in the semiconductor substrate; thereafter forming a spacer on sidewalls of the dielectric layer; and thereafter forming a source and a drain. The method may further include forming an interfacial layer on the semiconductor substrate before the forming the high k dielectric material layer.

In another embodiment, the method further includes forming an inter-level dielectric (ILD) material layer on the semiconductor substrate; and performing a chemical mechanical polishing (CMP) process to the semiconductor substrate. In furtherance of the embodiment, the method further includes forming a hard mask layer on the silicon layer; and thereafter patterning the hard mask layer before the patterning. The method may further include removing the hard mask layer before the performing the silicidation process.

The present disclosure also provides another embodiment of a method for making a semiconductor device having metal gate stacks. The method includes forming a gate stack on a semiconductor substrate; forming a source and a drain in the semiconductor substrate; forming a first silicide layer on the source and the drain; forming an inter-level dielectric (ILD) material layer on the semiconductor substrate; performing a chemical mechanical polishing (CMP) process to the semiconductor substrate; and thereafter forming a second silicide layer on the gate stack.

In this method, the forming the second silicide layer may include depositing a metal layer on the gate stack; applying an annealing to the substrate to react the metal layer and a silicon layer of the gate stack; and removing un-reacted metal layer from the substrate. The method may further include removing a portion of another gate stack, resulting in a gate trench; filling the gate trench with a metal layer; and applying a chemical mechanical polishing (CMP) process to the substrate.

The present disclosure also provides a semiconductor device. The device includes a source and a drain in a semiconductor substrate; a gate stack disposed on the semiconductor substrate and interposed between the source and the drain. The gate stack further includes a high k dielectric layer disposed on the semiconductor substrate; a metal layer disposed on the high k dielectric layer; and a silicide gate layer directly disposed on the metal layer, the silicide gate layer having a first thickness. The device also includes silicide features formed on the source and drain. The silicide features have a second thickness substantially less than the first thickness.

The disclosed device may further include a dielectric layer disposed on sidewalls of the gate stack; and a spacer disposed on the dielectric layer. The silicide gate layer may include a metal different from a metal in the silicide features in composition. The silicide gate layer may include a metal selected from the group consisting of titanium (Ti), nickel (Ni), cobalt (Co), platinum (Pt) and palladium (Pd). The metal layer may include a multi-film structure. The device may further include a second gate stack having a second metal layer disposed on the high k dielectric layer, the second metal layer being different from the metal layer in composition.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a source and a drain in a semiconductor substrate;
   a gate stack disposed on the semiconductor substrate and interposed between the source and the drain, wherein the gate stack includes:
      a high k dielectric layer disposed on the semiconductor substrate;
      a metal layer disposed on the high k dielectric layer; and
      a silicide gate layer directly disposed on the metal layer, the silicide gate layer having a first thickness; and
   silicide features formed on the source and the drain, the silicide features having a second thickness substantially less than the first thickness,
   wherein the gate stack has a work function, and
   wherein the gate stack is configured such that the metal layer determines the work function.

2. The semiconductor device of claim 1, wherein the gate stack has a gate length less than 50 nm.

3. The semiconductor device of claim 1, further comprising:
   dielectric layers disposed on sidewalls of the gate stack; and
   spacers disposed on the dielectric layers.

4. The semiconductor device of claim 3, further comprising:
   light doped drain (LDD) regions substantially aligned with edges of the dielectric layers,
   wherein the source and the drain are substantially aligned with edges of the spacers, and
   wherein the silicide features formed on the source and the drain are substantially aligned with edges of the spacers.

5. The semiconductor device of claim 1, wherein a metal element included in the silicide gate layer is different from a metal element included in the silicide features.

6. The semiconductor device of claim 1, wherein the silicide gate layer comprises a metal selected from the group consisting of titanium (Ti), nickel (Ni), cobalt (Co), platinum (Pt), palladium (Pd), tungsten (W), tantalum (Ta), erbium (Er), and combinations thereof.

7. The semiconductor device of claim 6, wherein the silicide gate layer includes a composition selected from the group consisting of $MSi$, $MSi_2$, $M_2Si$, $M_2Si_3$, $M_3Si_2$, $M_3Si$, and combinations thereof, M being the metal.

8. The semiconductor device of claim 1, wherein the metal layer comprises a multi-film structure.

9. The semiconductor device of claim 1, wherein the gate stack is configured such that the silicide gate layer does not determine the work function.

10. The semiconductor device of claim 1, wherein the metal layer includes a material selected from the group consisting of molybdenum nitride, tungsten nitride, tungsten, titanium aluminum nitride, and combinations thereof.

11. The semiconductor device of claim 1, wherein the gate stack includes a stress generated from a volume expansion during formation of the silicide gate layer, and
   wherein the semiconductor substrate includes a strained channel region formed by the stress passed from the gate stack.

12. The semiconductor device of claim 11, wherein the metal layer has a thickness less than about 50 angstrom.

* * * * *